(12) United States Patent
Shen

(10) Patent No.: US 12,744,498 B2
(45) Date of Patent: Sep. 22, 2026

(54) AUDIO AMPLIFIER

(71) Applicant: HARMAN INTERNATIONAL INDUSTRIES, INCORPORATED, Stamford, CT (US)

(72) Inventor: Ebing Shen, Shenzhen (CN)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 592 days.

(21) Appl. No.: 18/326,654

(22) Filed: May 31, 2023

(65) Prior Publication Data

US 2023/0402978 A1 Dec. 14, 2023

(30) Foreign Application Priority Data

Jun. 8, 2022 (CN) ........................ 202210647813.4

(51) Int. Cl.
*H03F 3/217* (2006.01)
*H03F 1/02* (2006.01)
*H03F 1/26* (2006.01)

(52) U.S. Cl.
CPC ......... *H03F 3/2173* (2013.01); *H03F 1/0255* (2013.01); *H03F 1/26* (2013.01); *H03F 2200/03* (2013.01)

(58) Field of Classification Search
CPC ........ H03F 3/2173; H03F 1/0255; H03F 1/26; H03F 2200/03; H03F 3/185; H03F 3/187; H03F 3/2175
USPC ....................................... 330/10, 251, 207 A
See application file for complete search history.

(56) References Cited

U.S. PATENT DOCUMENTS 9,503,023 B2 * 11/2016 Jorritsma ............... H03F 3/211
2013/0181748 A1 7/2013 Zajc
2020/0021256 A1 * 1/2020 Terwal ................... H03F 3/185

FOREIGN PATENT DOCUMENTS

WO 2017158723 A1 9/2017

OTHER PUBLICATIONS

European Search Report dated Oct. 17, 2023 for European Patent Application No. 23169588.3, 9 pages.

(Continued)

*Primary Examiner* — Hieu P Nguyen
(74) *Attorney, Agent, or Firm* — BROOKS KUSHMAN P.C.

(57) ABSTRACT

The present disclosure provides an audio amplifier circuit, including: a modulator circuit configured to modulate an audio input signal into a pulse width modulation (PWM) signal; a switch stage circuit configured to receive the PWM signal and amplify the PWM signal; a demodulator circuit configured to receive and demodulate the amplified PWM signal to obtain a demodulated audio signal, and to output the demodulated audio signal to a speaker; and a feedback circuit configured to feed back the demodulated audio signal output by the demodulator circuit, and to output a feedback signal to an input end of the modulator circuit. Here, the feedback circuit includes an analog-to-digital converter and a loop filter. The switch stage circuit includes a driver and two gallium nitride (GaN) field effect transistors (FETs).

16 Claims, 4 Drawing Sheets

(56) References Cited

OTHER PUBLICATIONS

Overgaard, J. E. F. et al., "Application Specific Integrated Gate-Drive Circuit for Diving Self-Oscillating Gallium Nitride & Logic-Level Power Transistors", 2018 IEEE Nordic Circuits and Systems Conference, Oct. 30, 2018, 6 pgs.

* cited by examiner

AUDIO AMPLIFIER

CROSS-REFERENCE TO RELATED APPLICATIONS

This application claims priority to CN Application Serial No. 202210647813.4 filed Jun. 8, 2022, the disclosure of which is hereby incorporated in its entirety by reference herein.

TECHNICAL FIELD

The present disclosure relates generally to audio amplifiers, and in particular to a Gallium Nitride (GaN)-based audio amplifier circuit for a high-power full-frequency audio amplifier.

BACKGROUND

One function of an audio (power) amplifier is to amplify a weak signal from an input audio source device to generate a current large enough to drive a speaker to playback sound. Different types of power amplifiers differ in internal signal processing, circuit design and production techniques when considering the differences in power output, impedance, distortion, dynamic range, channel separation, signal-to-noise ratio, efficiency, usage range and control functions.

In recent years, with the continuous development of the consumer market in the audio field, the demand for high-power audio amplifier products is increasing. At the same time, there are higher requirements for audio performance, efficiency, and size of high-power audio amplifiers.

Therefore, it is desired to develop a new solution to provide a high-power audio amplifier with good audio performance, high efficiency and small size.

SUMMARY

According to one aspect of the present disclosure, an audio amplifier circuit is provided. The audio amplifier includes a modulator circuit, a switch stage circuit, a demodulator circuit, and a feedback circuit. Among them, the modulator circuit is configured to modulate an audio input signal into a pulse width modulation (PWM) signal. The switch stage circuit is configured to receive the PWM signal and amplify the PWM signal. The demodulator circuit is configured to receive and demodulate the amplified PWM signal to obtain a demodulated audio signal, and to output the demodulated audio signal to a speaker. The feedback circuit is configured to feed back the demodulated audio signal output by the demodulator circuit, and to output a feedback signal to an input end of the modulator circuit.

According to one or more embodiments, the feedback circuit includes an analog-to-digital converter and a loop filter, wherein an input end of the analog-to-digital converter is connected to an output end of the demodulator circuit, an output end of the analog-to-digital converter is connected to an input end of the loop filter; and an output end of the loop filter is connected to the input end of the modulator circuit.

According to one or more embodiments, the loop filter is a high-order digital filter.

According to one or more embodiments, the switch stage circuit includes a driver, a first Gallium Nitride (GaN) field effect transistor (FET) and a second GaN FET, wherein a first output end of the driver is connected to a gate of the first GaN FET, and a second output end of the driver is connected to a gate of the second GaN FET.

According to one or more embodiments, the demodulator circuit includes a low-pass filter.

According to one or more embodiments, the modulator circuit and the feedback circuit are integrated as a controller.

According to one or more embodiments, the controller is configured to control two bridge push-pull circuit bridge-tied load (BTL) channels, wherein each BTL channel includes two drivers and four GaN FETs.

According to one or more embodiments, the first output end of the driver is connected to one end of a first resistor and a second resistor connected in parallel; the other end of the first resistor and the second resistor connected in parallel is connected to one end of a first magnetic bead; and the other end of the first magnetic bead is connected to the gate of the first GaN FET.

According to one or more embodiments, the second output end of the driver is connected to one end of a third resistor and a fourth resistor connected in parallel; the other end of the third resistor and the fourth resistor connected in parallel is connected to one end of a second magnetic bead; and the other end of the second magnetic bead is connected to the gate of the second GaN FET.

According to one or more embodiments, the audio amplifier circuit is applicable to in-vehicle power amplifiers and home audio power amplifiers.

BRIEF DESCRIPTION OF THE DRAWINGS

The present disclosure can be better understood by reading the following description of non-limiting embodiments with reference to the accompanying drawings, in which.

DETAILED DESCRIPTION

Figure 1:
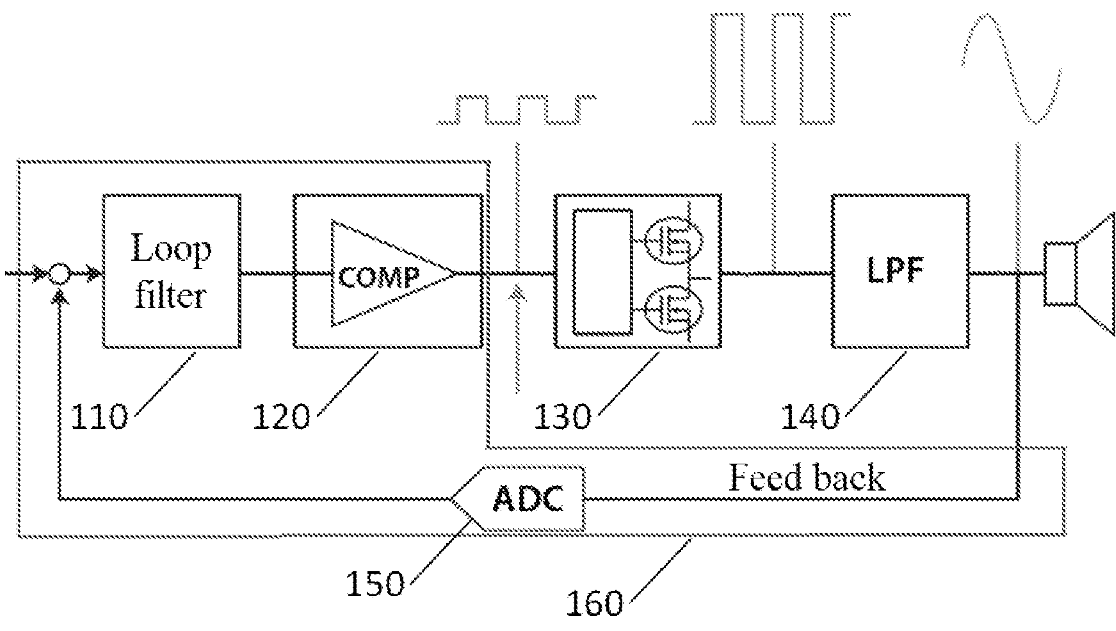
FIG. 1 schematically illustrates a schematic diagram of the circuit structure of an audio amplifier according to one or more embodiments of the present disclosure.

It should be understood that the following description of the embodiments is given for illustrative purposes only and is not limiting. The division of examples of the functional blocks, modules or units illustrated in the accompanying drawings should not be construed as indicating that these functional blocks, modules or units must be implemented as physically separate units. The functional blocks, modules, or units illustrated or described may be implemented as separate units, circuits, chips, functional blocks, modules, or circuit elements. One or more functional blocks or units may also be implemented in a common circuit, chip, circuit element, or unit.

The use of singular terms (such as, but not limited to, "one") is not intended to limit the number of items. The use of relational terms such as, but not limited to, "top", "bottom", "left", "right", "upper", "lower", "downward", "upward", "side", "first", "second" ("third", etc.), "entrance", "exit", etc., are used in the written description for clarity in specific reference to the accompanying drawings and are not intended to limit the scope of the present disclosure or the appended claims unless otherwise indicated. The terms "comprise/include" and "such as" are illustrative and not limiting, and unless otherwise specified, the word "may" entails "may, but not necessarily". Notwithstanding any other language used in the present disclosure, the embodiments illustrated in the accompanying drawings are examples given for purposes of illustration and explanation and are not the only embodiments of the subject matter herein.

In order to design a power amplifier, the following parameters may be taken into account:

- output power: the higher the output power, the higher the sound pressure level (SPL) of the speaker;
- frequency response: the human ear hearing range is in the 20-20 kHz range, and a wider frequency response range entails a deeper sound extension;
- total harmonic distortion plus noise (THD+N): it is expressed as a percentage; the harmonic distortion may include general harmonic distortion, intermodulation distortion, crossover distortion, clipping distortion, transient distortion, phase distortion; and the maximum acceptable THD+N is less than 1%, and the lower the distortion, the higher the sound fidelity; and
- efficiency: the ratio of output power to input power; the higher the efficiency, the less the heat generated, and the smaller the size of the heat sink required for the product.

Popular amplifier products on the market include analog amplifiers such as classes A, B, AB, G, H, and TD power amplifiers and digital amplifiers such as classes D and T power amplifiers. For the sake of understanding, the characteristics of the types of power amplifiers mentioned above are briefly described below in the present disclosure.

Class A power amplifiers are a class of power amplifiers that do not experience current cutoff (i.e., stop output) for the entire cycle of the signal. The advantages of class A power amplifiers are that there is no crossover distortion and switching distortion, and both THD+N and noise are relatively low, which can provide high sound quality. However, class A power amplifiers generate high heat and require a large heat sink when operating, the efficiency is low, and the output power is less than 50 W.

Class B power amplifiers are a class of power amplifiers in which the output is amplified by two transistors of the push-pull output stage in turn during the positive and negative half cycles of a sinusoidal signal, where the on-time of each transistor is half a cycle of the signal. The efficiency of class B power amplifiers is higher than that of class A power amplifiers. However, class B power amplifiers also generate high heat and require a large heat sink when operating, and produce large crossover distortion for low-level input signals. The output power of class B power amplifiers is less than 200 W.

Class AB power amplifiers are between class A power amplifiers and class B power amplifiers, and the on-time of each transistor in push-pull amplification is greater than half a cycle of the signal and less than one cycle. Class AB power amplifiers mitigate the crossover distortion problem of switch transistors for low input signals via static bias voltages. Class AB power amplifiers have relatively high sound quality, but their sound quality may be worse than that of class A power amplifiers. Class AB power amplifiers further have the advantage of, among other things, low noise, and their efficiency may be higher than that of class A power amplifiers and lower than that of class B amplifiers. In addition, class AB power amplifiers likewise may need a large heat sink when operating, and the output power is less than 200 W.

Class G power amplifiers are an improved form of class AB power amplifiers. Compared with class AB power amplifiers, class G power amplifiers, in addition to having the advantages of good sound quality and low distortion similar to class AB power amplifiers, also have a higher efficiency than class AB power amplifiers. However, the circuit structure of class G power amplifiers may be relatively complex, resulting in a large printed circuit board (PCB) size and high cost, and their noise may also be greater than that of class AB power amplifiers. If a high-power output of 500 W is desired, a large heat sink and fan are required.

The amplification circuit portion of class H power amplifiers has the same principle as class AB power amplifiers, except that the power supply portion uses a switch power supply with adjustable multi-stage output voltages to automatically detect the output power for the selection of the supply voltage. The efficiency of class H power amplifiers is higher than that of class AB power amplifiers, but the weight is lower than that of class G power amplifiers. The power supply portion of class H power amplifiers produces switching distortion, and the noise is greater than that of class AB power amplifiers. If a high-power output of 500 W is desired, a large heat sink and fan are also required.

The circuit structure of class TD power amplifiers is similar to that of the class AB power amplifiers, except that the power supply portion uses a completely independent adjustable digital power supply to track the input signal with a voltage progression value of 0.1 V, and automatically detects the power to adjust the voltage up or down. This class of power amplifiers utilize a high-precision adjustable digital power supply, which may need a special design for the power supply and may not be concentrated on a single chip. Therefore, this class of amplifiers may have high prices, and are mainly used in advanced acoustics, and the circuits thereof are also complex.

Class D power amplifiers use a high-frequency switching circuit to amplify audio signals. The specific working principle is as follows: class D power amplifiers use an asynchronous modulation approach, in which high-frequency carrier signals remain unchanged when the cycle of audio signals changes. Therefore, when the audio frequency is relatively low, the number of PWM carriers may still be high, so it may be advantageous to suppress high-frequency carriers and reduce distortion. The variable frequency band of the carrier is far away from the audio signal frequency, so there is no mutual interference with the fundamental wave. Class D power amplifiers have the following advantages: good sound quality, higher efficiency than that of Class AB, less heat dissipation and the resulting small size of the heat sink required. An output that can easily reach 1000 W without the need for a fan may be attained. However, the disadvantages of Class D power amplifiers are: electromagnetic interference (EMI) caused by complex designs, large switching noise and distortion, and switching on/off Pop noise.

The principle of class T power amplifiers is the same as that of class D power amplifiers, except that the signal portion uses digitally-programmable potentiometer (DPP) technology (e.g., the core thereof is the small signal adaptation algorithm and prediction algorithm). The working principle is as follows: the current of the audio signal into the speaker, after all being subjected to arithmetic processing by DPP, controls the on or off of the high-power high-frequency transistor, so as to achieve high-fidelity linear amplification of the audio signal. Such class T power amplifiers have the advantages of good sound quality of class AB power amplifiers and high efficiency of class D power amplifiers. However, the output power of the class T power amplifiers may be small, making its application range limited.

Based on the introduction of the various classes of power amplifiers mentioned above, it can be found that no matter what class of power amplifier it is based on, under the design condition that a power output of more than 200 W@ 4 ohm is required, it will always be limited by at least one of the following: size, SNR (signal-to-noise ratio), THD+N, and efficiency. The present disclosure will propose a new design solution below to provide a high-power output full-frequency audio power amplifier that meets the following performance requirements: Hi-res (high-resolution audio), small size, high SNR, low THD+N, high efficiency, and scalability.

FIG. 1 schematically illustrates a schematic block diagram of the circuit structure of an audio power amplifier according to one or more embodiments of the present disclosure. As shown, the circuit structure of the desired audio power amplifier includes a loop filter 110, a modulator 120, a switch stage circuit 130, a demodulator 140, and an analog-to-digital converter 150.

According to one or more embodiments, the loop filter 110 may be a high-order digital filter composed of a plurality of filters and is used for performing filtering processing of the received input signal. As an example, the loop filter 110 may be composed of a plurality of discrete elements through connections. As another example, the loop filter 110 may be composed of an integrated device capable of achieving the same functionality. The use of the integrated device to implement the loop filter 110 can minimize the parasitic parameters and reduce the complexity of the design. In addition, since the size of the integrated device is smaller than that of a filter circuit composed of a plurality of discrete elements, the size of the corresponding printed circuit board (PCB) can also be reduced.

The modulator 120 receives signals from the loop filter 110 and uses pulse width modulation (PWM) techniques to modulate the received signal that is output from the loop filter 110 into a square wave signal. As an example, it is possible to use only one operational amplifier as the main comparator, so as to implement the PWM modulator. Its working principle is that the original input signal (e.g., a sine wave) is input at one end of the operational amplifier, and a high-frequency triangle wave is input at the other end. When the input signal is zero, the output is a square wave with a 50% duty cycle, while when the input signal is not zero, the output is a square wave that varies with the input signal.

The signal that is output from the PWM modulator 120 is provided to the switch stage circuit 130. The switch stage circuit 130 performs power amplification of the PWM signal that is output from the PWM modulator 120, i.e., converts the small PWM signal into a high-voltage, high-current PWM signal. According to one or more embodiments, the switch stage circuit 130 may include a gate driver and two gallium nitride field effect transistors (GaN FETs). For example, the gate driver may be an integrated gate driver device.

The PWM signal that is output after amplification by the switch stage circuit 130 is provided to the demodulator 140. The demodulator 140 may demodulate the input audio signal out of the received PWM signal and provide it to the speaker (horn). Here, the demodulator 140 may include a low-pass filter (LPF). The low-pass filter is used to filter out high-order harmonic signals, thereby demodulating the input audio signal out. As an example, the LPF may be implemented as an LC output filter to act as a low-pass filter for the PWM signal at the GaN power switch stage.

Meanwhile, the signal that is output from the demodulator 140 is subjected to analog-to-digital conversion by the analog-to-digital converter (ADC) 150, and the converted signal is provided to the input end of the loop filter 110. As an example, the analog-to-digital converter 150 may be a high-resolution, ultra-fast, low-latency analog-to-digital converter.

As a result, the analog-to-digital converter 150, the loop filter 110, and the PWM modulator 120 form a feedback circuit module (see block 160 in FIG. 1). The feedback circuit module, by using a low-latency analog-to-digital converter (ADC 150), a high-order digital filter (loop filter 110), and a high-gain control loop (PWM modulator 120), and by feeding back signals sampled after the output from the low-pass filter LPF and before the speaker input (that is, post-filter feedback is used), is capable of further mitigating signal distortion, power supply rejection ratio, and frequency response flatness for horn impedance variations.

On the one hand, the circuit structure of the audio power amplifier improved based on a class D power amplifier design of one or more embodiments of the present disclosure as shown in FIG. 1. For example, by adopting post-filter feedback in combination with a digital loop (e.g., including a high-order digital filter and a high-gain control loop), this may avoid distortion caused by the following deficiencies in the design of conventional class D power amplifiers: the dependence of the output filter load on the audio frequency, the power stage dead time, power supply voltage fluctuations, and analog feedback loop limitations. Another advantage of using post-filter feedback and a digital loop is that the feedback signal can more accurately reflect the impact of the impedance of wires connected to the speaker on the sound, and performing filtering processing of the feedback signal by a high-order digital filter not only can filter out the noise signal in the feedback signal, but also can perform real-time gain adjustment of the input signal based on the feedback signal, thus stabilizing the system gain of the amplifier and reducing the system distortion of the amplifier and increasing the damping coefficient.

According to one or more embodiments, the feedback circuit module 160 including the analog-to-digital converter (ADC) 150, the loop filter 110, and the PWM modulator 120 can be integrated into a single system-on-chip (Soc) as a digital feedback controller in practical applications, thereby further reducing the complexity of the design and reducing the footprint of the PCB board, thus enabling the size of the PCB board to be further reduced.

On the other hand, the circuit structure of the audio power amplifier improved based on a class D power amplifier design of one or more embodiments of the present disclosure as shown in FIG. 1, by adopting the design solution of combining a gate driver with two gallium nitride field effect transistors (GaN FETs) in the switch stage circuit 130, can further mitigate the heat dissipation problem in the conventional class D power amplifier design, further improve the efficiency, and can realize the flat design of the product.

Heat sinks (with or without fans) are often required to dissipate the remaining heat in the power stage of high-power class D amplifiers. These heat sinks are large, heavy, and expensive. In contrast, the circuit structure of the improved audio power amplifier of the present disclosure uses a GaN switch (i.e., GaN FET) based circuit design in the switch stage circuit (i.e., power stage). Compared to the design of a conventional CMOS-based class D power stage, the size of the heat sink required to dissipate heat in the power stage of the high-power amplifier on the circuit board can be reduced and the need for a fan can be eliminated because of the significantly reduced switching loss of the GaN switch, its extremely low conduction loss, and its large-current capability.

Specifically, GaN FETs have smaller on-resistance (Rds on), size and gate charge (Qg), and higher drain current (Ids) than Metal Oxide Silicon Field Transistors (MOSFETs) under the same conditions. Thus, a minimum number of GaN FETs can be adapted to different power outputs, and the small Qg and the absence of body diodes and reverse recovery time make electromagnetic interference (EMI) easy to design. In addition, GaN FETs are smaller in size and thickness than MOSFETs and triodes, making it easier to reduce the size of the PCB used to implement audio power amplifiers.

The following table lists the comparison of various performance parameters of two kinds of GaN FETs with Mosfet.

| | GaN FET1 | GaN FET2 | MosFet |
|---|---|---|---|
| BVDss | 400 V | 100 V | 100 V |
| Rds(on) | 70 mohm(25 C.) | 9.5 m(25 C.)ohm | 26.5 mohm(25° C.) |
| | 100 mohm(125 C.) | 17.5 mohm(100 C.) | |
| Ids(max) | 31 A(25 C.) | 90 A(25 C.) | 36 A(25 C.) |
| | 20 A(100 C.) | 65 A(100 C.) | 25 A(100 C.) |
| | 14 A(125 C.) | | |
| Qg | 4.5 nC | 8 nC | 42 nC |
| Pin | PG-HSOF-8 | NA | D2Pak |
| Size (mm) | 11.6 × 9.9 × 2.3 | 7.5 × 4.6 × 0.51 | 10.67 × 15.88 × 4.83 |
| Operating Temperature | 0 C.-150 C. | −55 C.-150 C.(Tj) | −55 C.-175 C.(Tj) |

In addition, since a GaN FET and a high-order digital filter and a high-gain control loop (PWM modulator) are used in combination in the above audio power amplifier design of the present disclosure, the operating switching frequency (e.g., 1 M) can be increased and the LC size used to implement the low-pass filter can be reduced.

Figure 2:
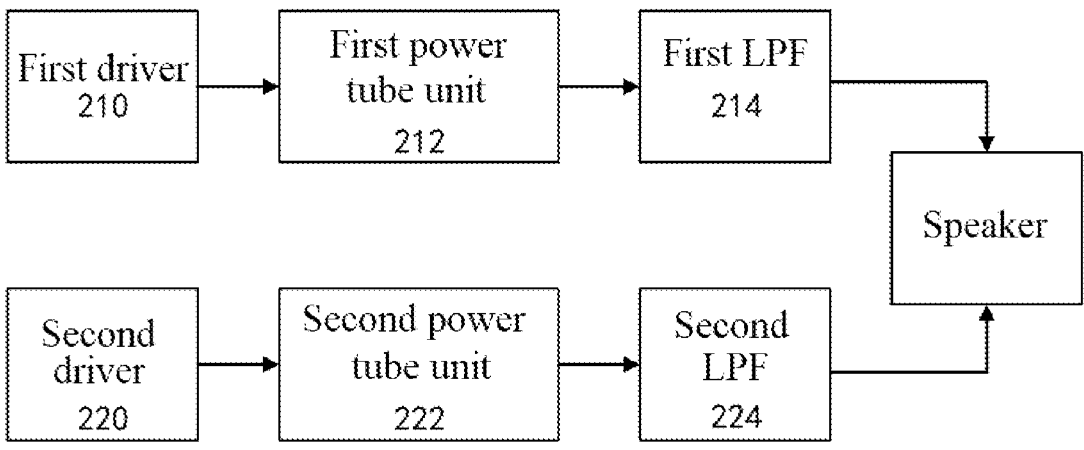
FIG. 2 illustrates, by way of example, a schematic diagram of a portion of the circuit structure of an audio amplifier according to one or more embodiments of the present disclosure.

FIG. 2 schematically illustrates a block diagram of a portion of the circuit structure of an audio amplifier circuit according to one or more embodiments of the present disclosure. For greater simplicity, FIG. 2 illustrates a principle diagram including only a switch stage circuit and a modulator. FIG. 2 illustrates that the circuit structure may be applicable to a 4-phase interleaved modulation mode.

As an example, the switch stage circuit shown in FIG. 2 uses a BTL structure with 2× drivers and 4× GaN FETs. As shown in FIG. 2, a first driver 210, a first power tube unit 212, and a first LPF 214 constitute a first amplification path for a first PWM signal. Among them, the first power tube unit 212 includes two GaN FETs connected in a half-bridge manner. The first driver drives the two GaN FETs in turn with signals of opposite phases, causing one GaN FET to turn on while keeping the other GaN FET to cut off. A second driver 220, a second power tube unit 222, and a second LPF 224 constitute a second amplification path for a second PWM signal. Among them, the second power tube unit 212 includes two GaN FETs connected in a half-bridge manner. The second driver drives the two GaN FETs in turn with signals of opposite phases, causing one GaN FET to turn on while keeping the other GaN FET to cut off. Two amplified signals that are obtained through two amplification paths, respectively, are provided to a speaker 230. The BTL structure with 2× drivers and 4× GaN FETs, as shown in FIG. 2, can further improve the system efficiency.

Figure 3:
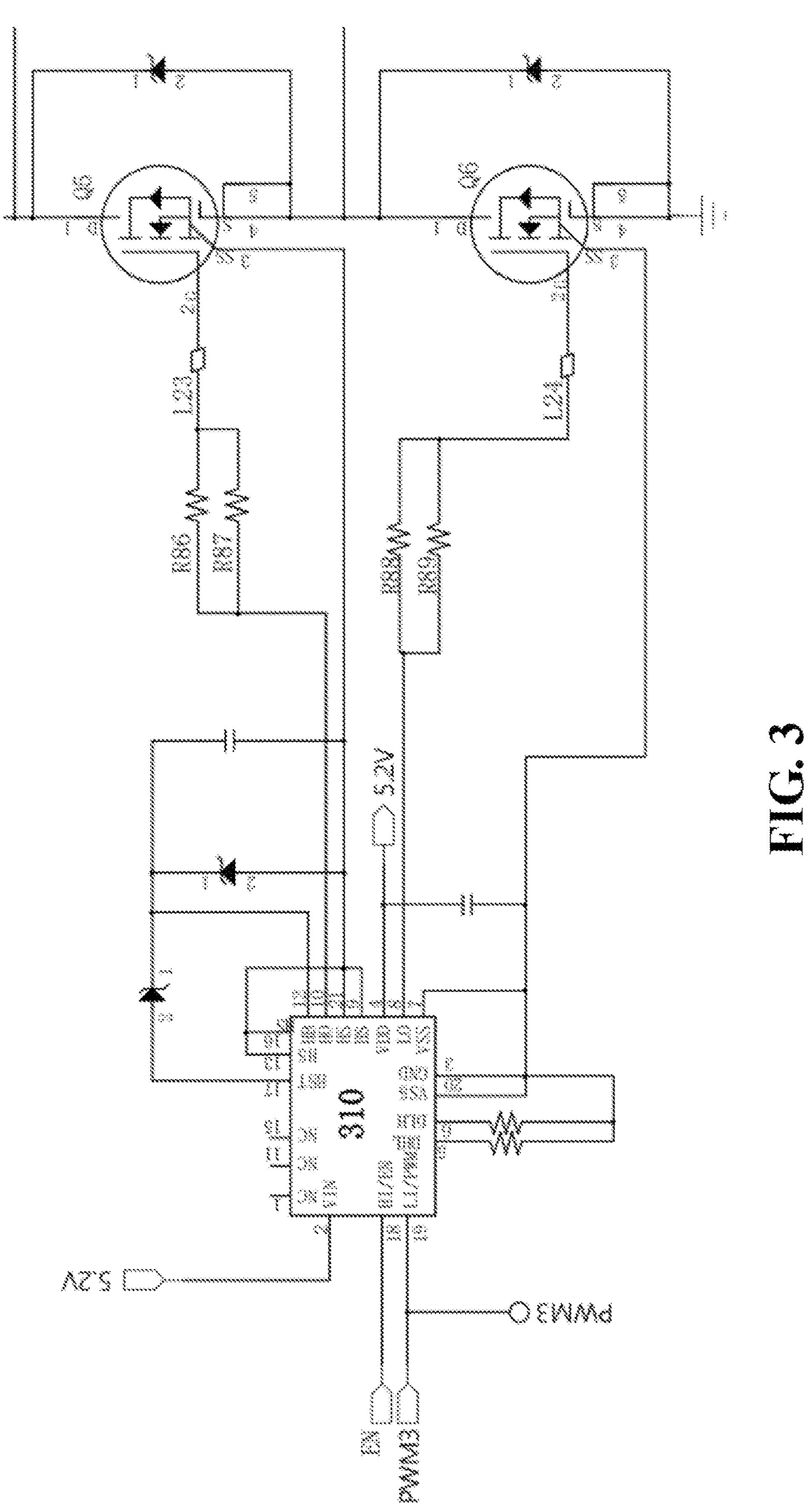
FIG. 3 schematically illustrates a diagram of an exemplary circuit configuration for implementing a switch stage circuit including driver and power tube portions according to one or more embodiments of the present disclosure.

FIG. 3 illustrates, by way of example, an example circuit structure for implementing a switch stage circuit that includes driver and power tube portions. The example circuit structure of the switch stage circuit shown in FIG. 3 is applicable to the switch stage circuit composed of the first driver 210 and the first power tube portion 212 shown in FIG. 2, and the switch stage circuit composed of the second driver 220 and the second power tube portion 222. As an example, the first driver 210 and the second driver 220 can be implemented by a suitable gate driver chip, such as the driver chip 310 as shown in the figure. Among them, the driver preferably has a dead time control function to ensure that the two GaN FETs (Q5 and Q6 in the figure) do not break down at the same time, thereby mitigating distortion. Based on the demonstration tests for GaN applications, the gate driver chip of the present disclosure may preferably be an LM1210 or Si8244 chip. For illustration purposes, the driver chip 310 in FIG. 3 uses the LM1210 as an example to illustrate the circuit design principles and not to limit them. It can be understood that, based on the principles of the technical solutions introduced in the present disclosure, when using the Si8244 chip, the same principles can be used to make corresponding design adjustments according to different pins of the chip.

Referring to FIG. 3, the driver chip 310 drives two GaN FETs (Q5 and Q6 in the figure) through the outputs of two output pins, HO and LO, respectively. According to one or more embodiments, the output pin HO of the driver is connected to one end of resistors R86 and R87 that are connected in parallel; the other end of the resistors R86 and R87 that are connected in parallel is connected to one end of a magnetic bead L23; and the other end of the magnetic bead L23 is connected to the gate of the GaN FET (Q5). According to one or more embodiments, the output pin LO of the driver 310 is connected to one end of resistors R88 and R89 that are connected in parallel; the other end of the resistors R88 and R89 that are connected in parallel is connected to one end of a magnetic bead L24; and the other end of the magnetic bead L24 is connected to the gate of the GaN FET (Q6). The use of the magnetic beads L23 and L24 can further improve the efficiency and can suppress EMI. Magnetic beads having different parameters have different effects on the efficiency. For example, the magnetic beads suitable for use in the circuit structure of the present disclosure may preferably be 120R or 3.3R.

Figure 4:
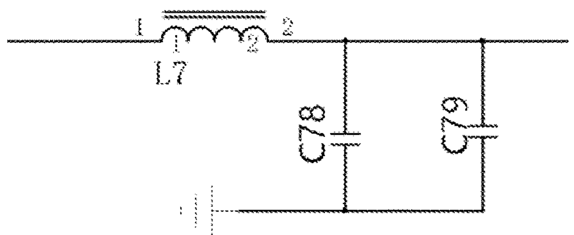
FIG. 4 illustrates, by way of example, a diagram of an exemplary circuit configuration for a low pass filter (LPF) according to one or more embodiments of the present disclosure.

FIG. 4 is an exemplary circuit diagram that can be used to separately implement the first LPF 214 and the second LPF 224. For example, the LPF circuit may be composed of an inductor L7, and capacitors C78 and C79. One end of the inductor L7 may be connected to the gate of one GaN FET (Q5) and the drain of the other GaN FET (Q6) among the two GaN FETs in FIG. 3. The other end of the inductor L7 is connected to the parallel connection end of the capacitors C78 and C79 and may be further connected to the speaker.

Figure 5:
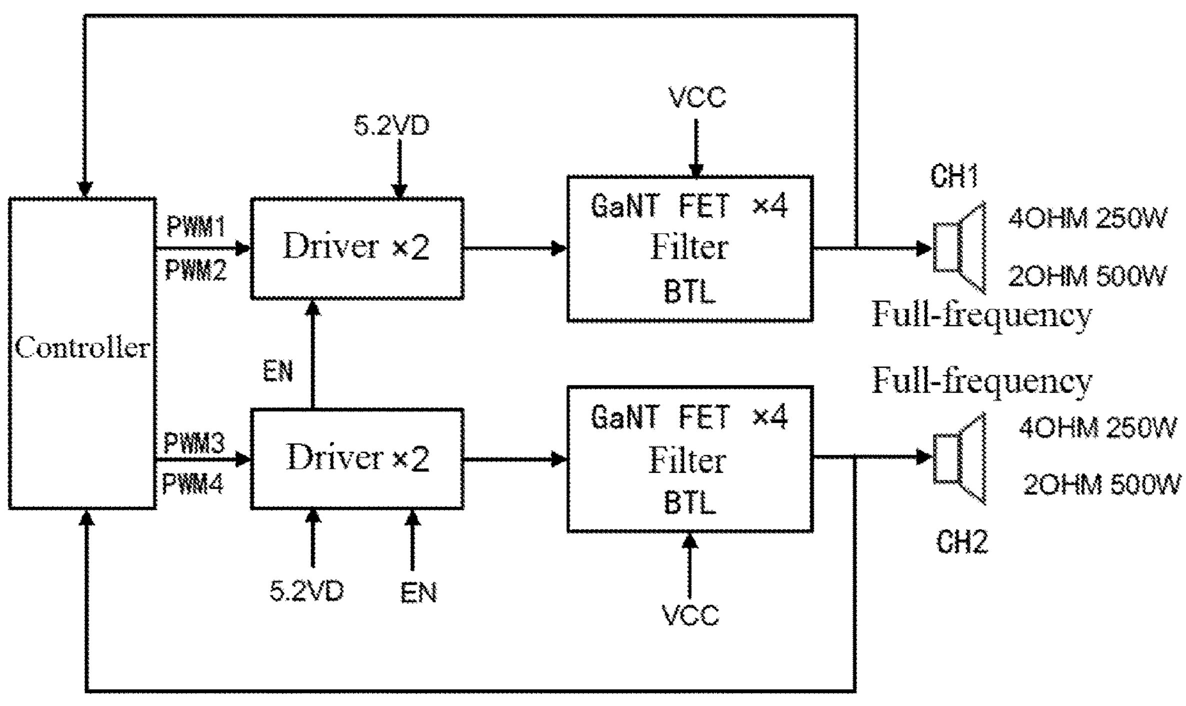
FIG. 5 illustrates, by way of example, a simplified schematic diagram of a power amplifier application.
Figure 6:
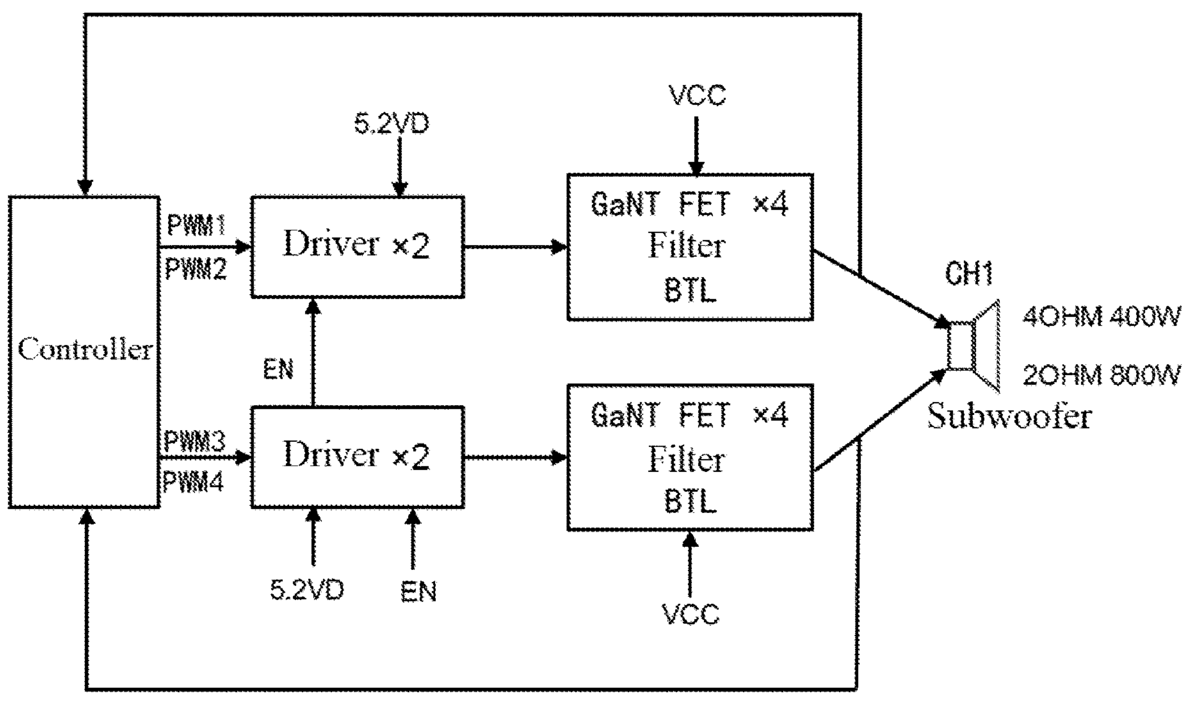
FIG. 6 illustrates, by way of example, a simplified schematic diagram of another power amplifier application.

The circuit design principle and solution of the present disclosure in conjunction with FIGS. 1 to 4 can be flexibly applied. For example, the circuit design principle and solution of the present disclosure can be applied to a 2*250 W@4 ohm and 2*500 W @2 ohm power amplifier application, and can be extended to a 1*800 W@2 ohm power amplifier application. Both power amplifier applications can achieve the effect of outputting high-resolution and low-distortion audio, which is in line with the HI-RES requirements. FIGS. 5 and 6 illustrate simplified schematic diagrams of the above two power amplifier applications. Here, the controller is configured to control two bridge push-pull circuit (BTL) channels, wherein each BTL channel includes two drivers and four GaN FETs.

The design solution of the above audio power amplifier of one or more embodiments provided in the present disclosure enables the application design of high resolution, small size, different high-power groups, and low distortion on a single amplifier board by using a minimum number of GaN FETs and digital loops. The design solution of the audio power amplifier provided in the present disclosure can be used in automobile power amplifiers, home acoustics power amplifiers, and the like.

Figure 7:
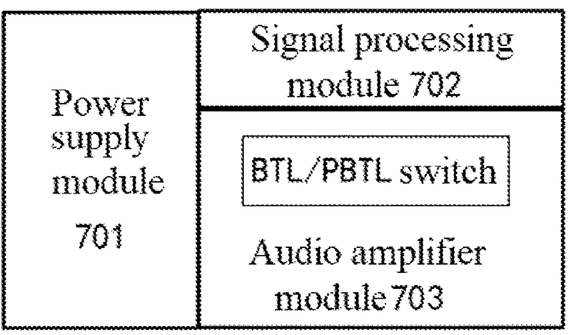
FIG. 7 illustrates a schematic diagram of the expansion of the application of the design solution of an audio power amplifier according to one or more embodiments of the present disclosure to an automobile power amplifier.

FIG. 7 is a schematic diagram of the expansion of the application of the design solution of an audio power amplifier of the present invention to an automobile power amplifier. The figure illustrates a power supply module 701, a signal processing module 702, and an audio amplifier module 703. Among them, the audio amplifier module 702 may use the audio amplifier design circuit that has a digital loop and uses GaNs as described above in the present disclosure, and may also include a BTL or PBTL switch design (BTL/PBTL switch). Since the audio amplifier module 702 may be designed in a flat manner, the power supply module 701 may also be implemented with GaN-based power supply boards that meet different output power requirements, and the GaN-based power supply boards may be designed accordingly to be slimmer and easy to replace flexibly. The signal processing module (signal input stage) 703 may be implemented by a digital signal processor (DSP) and have classic Bluetooth (BT) or Bluetooth Low Energy (BLE) transmission capabilities. The DSP may be configured as a digital frequency divider instead of a conventional analog frequency divider, so that the size of the signal processing module portion can also be reduced. The above configuration allows the size of each module portion to be reduced accordingly, making it more flexible for a variety of assembly environments.

The design solution of the audio power amplifier circuit provided in the present disclosure, by using a digital feedback loop in combination with a minimum number of GaN FETs, obtains an audio power amplifier that satisfies Hi-res, small size, high SNR, low THD+N, high efficiency, high damping coefficient, and flexible scalability.

The schematic circuit principle diagram and configuration schematic diagram herein are only exemplary circuit implementation schematic diagrams given for the better understanding and implementation of the teachings of the present disclosure by those skilled in the art, and are not intended to be a specific limitation of the technical solutions of the present invention. It can be understood by those skilled in the art that components may be added or subtracted, or the parameter values of components may be changed, depending on the specific application conditions of the circuit.

Clause 1. In some embodiments, an audio amplifier circuit comprises:

a modulator circuit configured to modulate an audio input signal into a pulse width modulation (PWM) signal;

a switch stage circuit configured to receive the PWM signal and amplify the PWM signal;

a demodulator circuit configured to receive and demodulate the amplified PWM signal to obtain a demodulated audio signal, and to output the demodulated audio signal to a speaker; and a feedback circuit configured to feed back the demodulated audio signal output by the demodulator circuit, and to output a feedback signal to an input end of the modulator circuit.

Clause 2. The audio amplifier circuit according to clause 1, wherein the feedback circuit comprises an analog-to-digital converter and a loop filter, wherein an input end of the analog-to-digital converter is connected to an output end of the demodulator circuit, an output end of the analog-to-digital converter is connected to an input end of the loop filter, and an output end of the loop filter is connected to an input end of the modulator circuit.

Clause 3. The audio amplifier circuit according to clause 2, wherein the loop filter is a high-order digital filter.

Clause 4. The audio amplifier circuit according to any one of the preceding clauses, wherein the switch stage circuit comprises a driver, and a first GaN FET and a second GaN FET, wherein a first output end of the driver is connected to a gate of the first GaN FET, and a second output end of the driver is connected to a gate of the second GaN FET.

Clause 5. The audio amplifier circuit according to any one of the preceding clauses, wherein the demodulator circuit comprises a low-pass filter.

Clause 6. The audio amplifier circuit according to any one of the preceding clauses, wherein the modulator circuit and the feedback circuit are integrated as a controller.

Clause 7. The audio amplifier circuit according to any one of the preceding clauses, wherein the controller is configured to control two bridge push-pull circuit (BTL) channels, wherein each BTL channel comprises two drivers and four GaN FETs.

Clause 8. The audio amplifier circuit according to any one of the preceding clauses, wherein the first output end of the driver is connected to one end of a first resistor and a second resistor connected in parallel; the other end of the first resistor and the second resistor connected in parallel is connected to one end of a first magnetic bead; and the other end of the first magnetic bead is connected to the gate of the first GaN FET.

Clause 9. The audio amplifier circuit according to any one of the preceding clauses, wherein the second output end of the driver is connected to one end of a third resistor and a fourth resistor connected in parallel; the other end of the third resistor and the fourth resistor connected in parallel is connected to one end of a second magnetic bead; and the other end of the second magnetic bead is connected to the gate of the second GaN FET.

Clause 10. The audio amplifier circuit according to any one of the preceding clauses, wherein the audio amplifier circuit is applicable to in-vehicle power amplifiers and home audio power amplifiers.

The description of the implementations has been presented for the purposes of illustration and description. Suitable modifications and changes to the implementations may be performed in view of the above description or the suitable modifications and changes may be obtained through practical methods. The described methods and associated actions may also be performed in various sequences, in parallel and/or simultaneously, in addition to the order described in the present application. The system described is exemplary in nature and may include other elements and/or omit elements. The subject matter of the present disclosure includes all novel and non-obvious combinations of the various systems and configurations disclosed with other features, functions, and/or properties.

As used in the present application, elements or steps listed in the singular form and preceded by the word "an/one" should be understood as not excluding a plurality of the elements or steps, unless such exclusion is indicated. Furthermore, references to "one implementation" or "one example" of the present disclosure are not intended to be interpreted as excluding the existence of additional implementations that also incorporate the listed features. The present invention has been described above with reference to particular implementations. However, it will be understood by those of ordinary skill in the art that, without departing from the broad spirit and scope of the present invention as set forth in the appended claims, various modifications and changes may be made thereto.

What is claimed is:

1. An audio amplifier circuit, comprising:

a modulator circuit configured to modulate an audio input signal into a pulse width modulation (PWM) signal;

a switch stage circuit configured to receive the PWM signal and to amplify the PWM signal;

a demodulator circuit configured to receive and demodulate the amplified PWM signal to obtain a demodulated audio signal, and to output the demodulated audio signal to a speaker; and a feedback circuit configured to feed back the demodulated audio signal output by the demodulator circuit, and to output a feedback signal to an input end of the modulator circuit, wherein the switch stage circuit comprises a driver and a first Gallium Nitride (GaN) field effect transistor (FET) and a second GaN FET, wherein a first output end of the driver is connected to a gate of the first GaN FET, and a second output end of the driver is connected to a gate of the second GaN FET, wherein the first output end of the driver is connected to one end of a first resistor and a second resistor connected in parallel; the other end of the first resistor and the second resistor connected in parallel is connected to one end of a first magnetic bead; and the other end of the first magnetic bead is connected to the gate of the first GaN FET.

2. The audio amplifier circuit according to claim 1, wherein the feedback circuit comprises an analog-to-digital converter and a loop filter, wherein an input end of the analog-to-digital converter is connected to an output end of the demodulator circuit, an output end of the analog-to-digital converter is connected to an input end of the loop filter, and an output end of the loop filter is connected to the input end of the modulator circuit.

3. The audio amplifier circuit according to claim 2, wherein the loop filter is a high-order digital filter.

4. The audio amplifier circuit according to claim 1, further comprising a controller including the modulator circuit and the feedback circuit is configured to control two bridge push-pull circuit bridge tied load (BTL) channels, wherein each BTL channel comprises two drivers and four GaN FETs.

5. The audio amplifier circuit according to claim 1, wherein the second output end of the driver is connected to one end of a third resistor and a fourth resistor connected in parallel; the other end of the third resistor and the fourth resistor connected in parallel is connected to one end of a second magnetic bead; and the other end of the second magnetic bead is connected to the gate of the second GaN FET.

6. The audio amplifier circuit according to claim 1, wherein the audio amplifier circuit is applicable to in-vehicle power amplifiers and home audio power amplifiers.

7. The audio amplifier circuit according to claim 1, wherein the demodulator circuit comprises a low-pass filter.

8. The audio amplifier circuit according to claim 1, wherein the modulator circuit and the feedback circuit are integrated as a controller.

9. An audio amplifier circuit, comprising:

a modulator circuit configured to modulate an audio input signal into a first signal;

a switch stage circuit configured to receive the first signal and to amplify the first signal;

a demodulator circuit configured to receive and demodulate the amplified first signal to obtain a demodulated audio signal, and to output the demodulated audio signal to a speaker; and a feedback circuit configured to feed back the demodulated audio signal output by the demodulator circuit, and to output a feedback signal to an input end of the modulator circuit, wherein the switch stage circuit comprises a driver and a first Gallium Nitride (GaN) field effect transistor (FET) and a second GaN FET, wherein a first output end of the driver is connected to a gate of the first GaN FET, and a second output end of the driver is connected to a gate of the second GaN FET, wherein the first output end of the driver is connected to one end of a first resistor and a second resistor connected in parallel; the other end of the first resistor and the second resistor connected in parallel is connected to one end of a first magnetic bead; and the other end of the first magnetic bead is connected to the gate of the first GaN FET.

10. The audio amplifier circuit according to claim 9, wherein the feedback circuit comprises an analog-to-digital converter and a loop filter, wherein an input end of the analog-to-digital converter is connected to an output end of the demodulator circuit, an output end of the analog-to-digital converter is connected to an input end of the loop filter, and an output end of the loop filter is connected to the input end of the modulator circuit.

11. The audio amplifier circuit according to claim 10, wherein the loop filter is a high-order digital filter.

12. The audio amplifier circuit according to claim 9, further comprising a controller including the modulator circuit and the feedback circuit configured to control two bridge push-pull circuit bridge tied load (BTL) channels, wherein each BTL channel comprises two drivers and four GaN FETs.

13. The audio amplifier circuit according to claim 9, wherein the second output end of the driver is connected to one end of a third resistor and a fourth resistor connected in parallel; the other end of the third resistor and the fourth resistor connected in parallel is connected to one end of a second magnetic bead; and the other end of the second magnetic bead is connected to the gate of the second GaN FET.

14. The audio amplifier circuit according to claim 9, wherein the audio amplifier circuit is applicable to in-vehicle power amplifiers and home audio power amplifiers.

15. The audio amplifier circuit according to claim 9, wherein the demodulator circuit comprises a low-pass filter.

16. The audio amplifier circuit according to claim 9, wherein the first signal is a pulse width modulated (PWM) signal.

* * * * *